(12) United States Patent
Merry et al.

(10) Patent No.: US 11,772,958 B2
(45) Date of Patent: Oct. 3, 2023

(54) MASS FLOW CONTROL BASED ON MICRO-ELECTROMECHANICAL DEVICES

(71) Applicant: APPLIED MATERIALS, INC., Santa Clara, CA (US)

(72) Inventors: Nir Merry, Mountain View, CA (US); Paul Wirth, Kalispell, MT (US); Ming Xu, San Jose, CA (US); Sushant Koshti, Sunnyvale, CA (US); Raechel Chu-Hui Tan, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 80 days.

(21) Appl. No.: 17/475,294

(22) Filed: Sep. 14, 2021

(65) Prior Publication Data
US 2022/0083081 A1 Mar. 17, 2022

Related U.S. Application Data (60) Provisional application No. 63/079,915, filed on Sep. 17, 2020, provisional application No. 63/079,925, filed on Sep. 17, 2021.

(51) Int. Cl.
*B81B 3/00* (2006.01)
*G01F 1/684* (2006.01)
(Continued)

(52) U.S. Cl.
CPC .......... *B81B 3/0018* (2013.01); *G01F 1/6845* (2013.01); *G01F 1/72* (2013.01);
(Continued)

(58) Field of Classification Search
CPC .......... B81B 3/0018; B81B 2201/0292; B81B 2203/01; B81B 2203/0315;
(Continued)

(56) References Cited

U.S. PATENT DOCUMENTS 9,500,615 B2 11/2016 Hultmark et al.
10,288,492 B2 5/2019 Arwatz et al.
(Continued)

FOREIGN PATENT DOCUMENTS

JP 2003083789 A 3/2003
JP 2015194429 A 11/2015
(Continued)

OTHER PUBLICATIONS

International Search Report and Written Opinion of International Application No. PCT/US2021/050728 dated Dec. 13, 2021, 10 pgs.
(Continued)

*Primary Examiner* — Minh Q Le
(74) *Attorney, Agent, or Firm* — Lowenstein Sandler LLP (57) ABSTRACT

Disclosed herein are embodiments of a mass flow control apparatus, systems incorporating the same, and methods using the same. In one embodiment, a mass flow control apparatus comprises a flow modulating valve configured to modulate gas flow in a gas flow channel, a sensor device, such as a micro-electromechanical (MEMS) device, configured to generate a signal responsive to a condition of the gas flow, and a processing device operatively coupled to the flow modulating valve and the sensor device to control the flow modulating valve based on a signal received from the sensor device.

18 Claims, 7 Drawing Sheets

(51) Int. Cl.
*G01F 1/72* (2006.01)
*G01F 1/86* (2006.01)
*G05D 7/06* (2006.01)

(52) U.S. Cl.
CPC ............ *G01F 1/86* (2013.01); *G05D 7/0623* (2013.01); *G05D 7/0647* (2013.01); *B81B 2201/0292* (2013.01); *B81B 2203/01* (2013.01); *B81B 2203/0315* (2013.01); *B81B 2203/0338* (2013.01); *B81B 2207/11* (2013.01)

(58) Field of Classification Search
CPC ......... B81B 2203/0338; B81B 2207/11; G01F 1/6845; G01F 1/72; G01F 1/86; G01F 15/005; G01F 15/002; G05D 7/0647; G05D 7/0623; G05D 7/0635
USPC ....... 137/487.5; 156/345.15, 345.24, 345.26; 118/715
See application file for complete search history.

(56) References Cited

U.S. PATENT DOCUMENTS

| | | | |
|---|---|---|---|
| 10,837,813 | B2 | 11/2020 | Arwatz et al. |
| 2007/0044572 | A1* | 3/2007 | Davis ................. G01F 1/86 73/861.42 |
| 2007/0240778 | A1* | 10/2007 | L'Bassi ............... G05D 7/0664 137/883 |
| 2008/0167748 | A1* | 7/2008 | Ding ................. G05D 16/2046 700/121 |
| 2009/0248213 | A1* | 10/2009 | Gotoh ................. G05D 7/0635 700/282 |
| 2011/0193183 | A1* | 8/2011 | Agarwal ............. B01J 19/0046 257/E29.022 |
| 2012/0011940 | A1 | 1/2012 | Huang et al. |
| 2012/0076935 | A1* | 3/2012 | Ding .................... G05D 7/0635 118/704 |
| 2012/0116596 | A1 | 5/2012 | Yoneda et al. |
| 2012/0216888 | A1* | 8/2012 | Ding .................... G05D 7/0635 137/561 R |
| 2014/0158211 | A1* | 6/2014 | Ding .................... G01F 15/003 137/486 |
| 2014/0299204 | A1 | 10/2014 | Somani |
| 2014/0327003 | A1* | 11/2014 | Fuergut ................. H01L 21/784 156/345.24 |
| 2015/0260565 | A1* | 9/2015 | Smirnov ............. G05D 7/0635 73/1.34 |
| 2016/0124440 | A1 | 5/2016 | Takijiri et al. |
| 2016/0202200 | A1* | 7/2016 | Nakano ............. G01N 33/0067 73/23.31 |
| 2018/0172491 | A1* | 6/2018 | Ding ...................... G01F 25/15 |
| 2018/0188748 | A1* | 7/2018 | Xu ........................ G01F 1/696 |
| 2018/0208457 | A1* | 7/2018 | Chou .................... B81B 3/0018 |
| 2018/0252559 | A1 | 9/2018 | Hultmark et al. |
| 2019/0279888 | A1* | 9/2019 | Gopalakrishnan .......................... H01L 21/67253 |
| 2019/0381260 | A1 | 12/2019 | Hultmark et al. |
| 2020/0081459 | A1* | 3/2020 | L'Bassi ................ G05D 7/0635 |
| 2020/0116534 | A1 | 4/2020 | Hase et al. |
| 2020/0233006 | A1 | 7/2020 | Fan et al. |

FOREIGN PATENT DOCUMENTS

| | | |
|---|---|---|
| KR | 20130008767 A | 1/2013 |
| WO | 2004/063679 A1 | 7/2004 |
| WO | 2019/195292 A1 | 10/2019 |

OTHER PUBLICATIONS

International Search Report and Written Opinion of International Application No. PCT/US2021/050730 dated Feb. 4, 2022, 10 pgs.

* cited by examiner

MASS FLOW CONTROL BASED ON MICRO-ELECTROMECHANICAL DEVICES

CROSS-REFERENCE TO RELATED APPLICATION(S)

This application claims the benefit of priority of U.S. Provisional Patent Application No. 63/079,915, filed on Sep. 17, 2020, and of U.S. Provisional Patent Application No. 63/079,925, filed on Sep. 17, 2020, the disclosures of which are hereby incorporated by reference herein in their entireties.

TECHNICAL FIELD

Embodiments of the present disclosure relate, in general, to methods and apparatuses for controlling a flow rate of a gas.

BACKGROUND

Controlling a flow rate of a gas presents a common challenge in manufacturing systems. In some manufacturing systems, process gases (i.e., gases used during semiconductor fabrication processes) and/or cleaning gases (i.e., gases used to clean a manufactured device and/or a chamber used in manufacturing an electronic device) may have precise delivery targets including high mass flow rates (i.e., 500 standard liters per minute or more), as well as the ability to precisely control low flow rates (i.e., 10 standard liters per minute or less). Conventional manufacturing systems often use one or more mass flow controllers (MFCs) to measure and control the mass flow rates of process gases.

Each type of MFC (e.g., thermal-based MFCs, pressure-based MFCs, rate-of-decay-based MFCs, etc.) may impose one or more limitations, depending on the application in which the MFC is used. For example, a thermal MFC utilizes a thermal sensor to measure flow and control a needle valve to modulate the flow in the direction of a downstream process chamber. The feedback of such thermal sensors is very slow, resulting in a slow response rate of the MFC (on the order of 100 milliseconds or longer). This renders thermal MFCs impractical for manufacturing applications that have precise gas control and timing requirements.

SUMMARY

Certain embodiments of the present disclosure relate to apparatuses, systems, and methods for regulating mass flow control based on micro-electromechanical (MEMS) devices. In one aspect of the present disclosure, a mass flow control apparatus comprises a flow modulating valve configured to modulate gas flow in a gas flow channel, a sensor device (e.g., a MEMS device) configured to generate a signal responsive to conditions of the gas flow, and a processing device operatively coupled to the flow modulating valve and the sensor device. In some embodiments, the processing device is configured to control the flow modulating valve based on a signal received from the sensor device.

In another aspect of the present disclosure, a system comprises a process chamber, a gas flow channel arranged to deliver gas from a gas source to the process chamber, a flow modulating valve configured to modulate gas flow in the gas flow channel, one or more micro-electromechanical (MEMS) devices, and a processing device operatively coupled to the flow modulating valve and the MEMS device. In some embodiments, the one or more MEMS devices are configured to generate gas flow signals responsive to conditions of the gas flow in the gas flow channel. In some embodiments, the processing device is configured to control the flow modulating valve based on signals received from the one or more MEMS devices.

In another aspect of the present disclosure, a method comprises transmitting a control signal to a flow modulating valve configured to modulate mass flow in a flow channel, receiving a feedback signal from a MEMS device, computing an updated control signal based on the feedback signal from the MEMS device, and transmitting the updated control signal to the flow modulating valve. In some embodiments, the MEMS device is disposed downstream from the flow modulating valve. In some embodiments, the feedback signal is indicative of conditions of the mass flow.

BRIEF DESCRIPTION OF DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments described herein relate to a mass flow control apparatus, a system incorporating a mass flow control apparatus into a gas delivery system (e.g., for a processing chamber), and a method of modulating gas flow in a gas flow channel with a mass flow control apparatus. The mass flow control apparatus includes, in some embodiments, a flow modulator that includes a flow modulating valve for modulating gas flow in a gas flow channel, a sensor device for generating signals responsive to gas flow conditions, and a processing device operatively coupled to both the flow modulator and the sensor device. The sensor device may be a MEMS device having a free-standing sensing element that is disposed directly in the flow path of the gas flow channel, which transmits its signal to the processing device. The processing device then computes one or more parameters of the gas flow, such as a temperature, a pressure, a gas velocity, and a gas flow rate, and actuates the flow modulating valve to reach a target flow rate (by increasing or restricting gas flow) based on the signal from the MEMS device.

In general, it is advantageous to precisely control the flow rate of a process gas used in a manufacturing process to better control the process and to allow precise processing constraints to be met. The low transient response rates of current MFCs, which are generally on the order of 100 milliseconds or greater, are unsuitable for applications that entail precise control of gas dosing, such as the delivery of small quantities of gas as well as pulses of one or more gases ("mass flow pulses") in succession having pulse widths on the order of 100 milliseconds or less.

Embodiments of the present disclosure advantageously overcome the limitations of current MFCs by utilizing a MEMS device directly within the flow path of the gas to provide fast (i.e., transient response of less than about 1 millisecond) and accurate flow feedback. A processing device, such as an EtherCAT® plug-in module (EPM), operatively coupled to the MEMS device can more quickly control an MFC or a standalone actuatable valve based on the fast flow feedback as compared to traditional MFCs. While various embodiments may utilize MEMS devices as the sole source of feedback, flow feedback from an MFC device may also be advantageously used together with the MEMS feedback, for example, for the purposes of calibration or verification (e.g., to ensure consistency between the measured signals).

In addition to flow feedback, the MEMS device may be advantageously utilized to provide fast and accurate temperature measurements at any location of a gas supply line, including at the source, near the valve, near an entrance to a process chamber (i.e., the point of delivery), or within the process chamber. The temperature measurements may be monitored in real-time by the processing device, which may in turn transmit power output commands to heating units at different locations of the gas supply line.

Certain embodiments advantageously utilize one or more MEMS devices at various locations of the gas supply line, which may be used to account for time delays due to distances between flow modulating valves and MEMS devices. Certain embodiments also advantageously utilize multiple MEMS devices in system architectures that include flow ratio controllers, with multiple MEMS devices being utilized across various flow paths in both parallel and series configurations. Multiple sensors in series, for example, may be used to account for drift in individual sensors, as well as for calibration and diagnostic purposes.

Certain embodiments also advantageously utilize one or more MEMS devices in pulsed gas delivery systems to deliver precise pulses of one or more different gases in rapid succession, with pulse widths on the order of milliseconds or less (e.g., 20 millisecond pulses).

Several embodiments herein are discussed with respect to MFCs or components thereof used for restricting the flow rate of a gas used in a manufacturing system. However, it should be understood that the embodiments described herein also apply to other purposes outside of manufacturing, such as building ventilation systems and ventilators for medical use.

Figure 1:
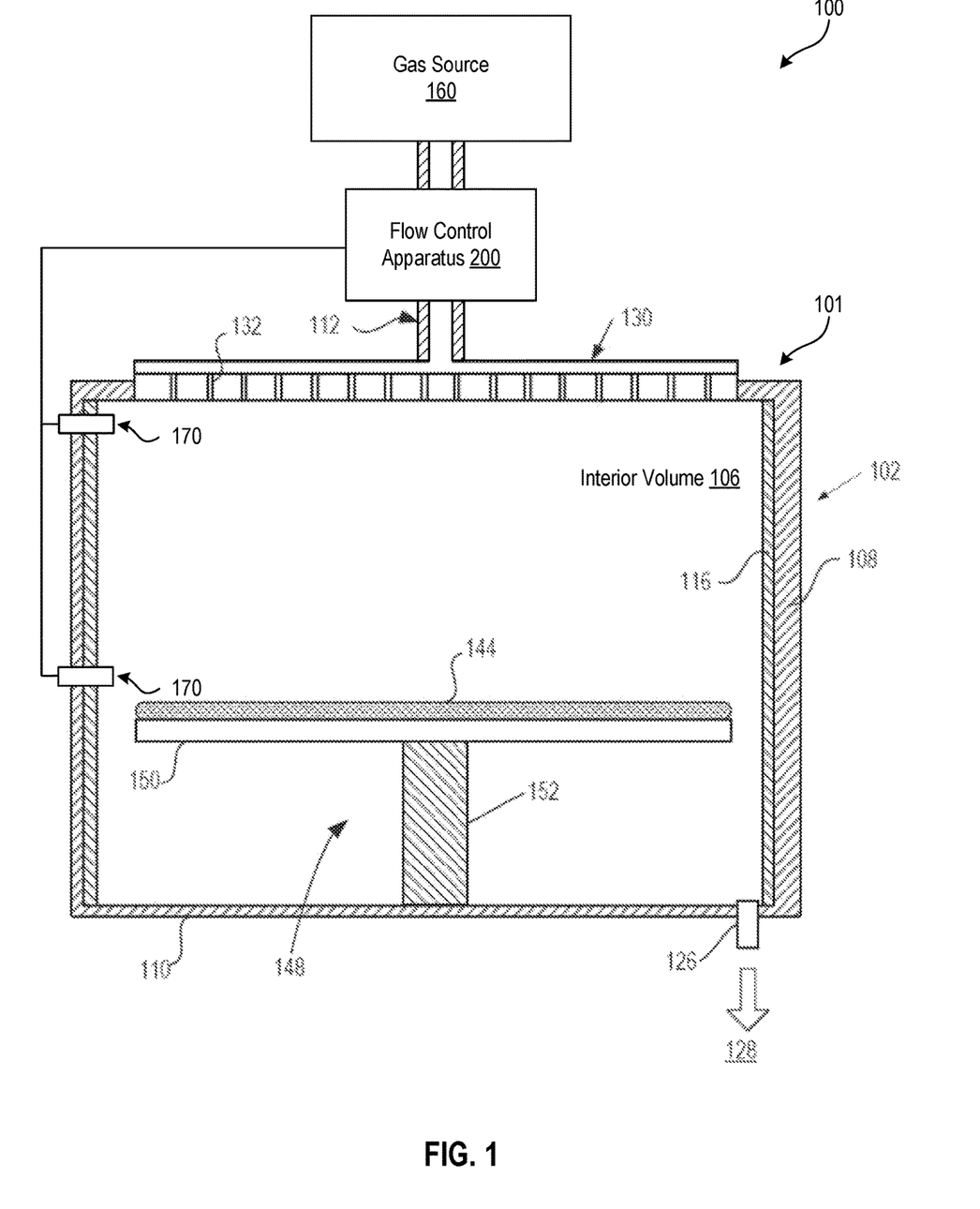
FIG. 1 illustrates an exemplary system that includes a processing chamber, a gas source, and a flow control apparatus in accordance with embodiments of the present disclosure.

FIG. 1 depicts a system 100 that includes a chamber 101 (e.g., a semiconductor processing chamber), a gas source 160, and a flow control apparatus 200 in accordance with embodiments of the present disclosure. The chamber 101 may be used for processes in which a corrosive plasma environment is provided. For example, the chamber 101 may be a chamber for a plasma etcher or plasma etch reactor, a plasma cleaner, and so forth. In alternative embodiments other processing chambers may be used, which may or may not be exposed to a corrosive plasma environment. Some examples of chamber components include a chemical vapor deposition (CVD) chamber, a physical vapor deposition (PVD) chamber, an atomic layer deposition (ALD) chamber, an ion assisted deposition (IAD) chamber, an etch chamber, and other types of processing chambers. In some embodiments, chamber 101 may be any chamber used in an electronic device manufacturing system.

In one embodiment, the chamber 101 includes a chamber body 102 and a showerhead 130 that encloses an interior volume 106. The showerhead 130 may include a showerhead base and a showerhead gas distribution plate. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel, or other suitable material such as titanium. The chamber body 102 generally includes sidewalls 108 and a bottom 110.

An outer liner 116 may be disposed adjacent the sidewalls 108 to protect the chamber body 102. The outer liner 116 may be fabricated to include one or more apertures. In one embodiment, the outer liner 116 is fabricated from aluminum oxide.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the chamber 101.

The gas source 160 may be coupled to the chamber 101 to provide process and/or cleaning gases via supply line 112 to the interior volume 106 through a showerhead 130. The flow control apparatus 200 may be coupled to the gas source 160 and chamber 101. The flow control apparatus 200 may be used to measure and control the flow of gas from the gas source 160 to interior volume 106. An exemplary flow control apparatus 200 is described in greater detail below with respect to FIG. 2. In some embodiments, one or more gas sources 160 may be coupled to chamber 101 to provide gases to the interior volume 106. In such embodiments, one or more flow control apparatuses 200 may be coupled to each gas source 160 and chamber 101. In other embodiments, a single flow control apparatus 200 may be coupled to one or more gas sources 160. In some embodiments, the flow control apparatus 200 may comprise a flow ratio controller to control the flow of gases to the chamber 101 (e.g., through one or more supply lines 112), or to other processing chambers.

The showerhead 130 may be supported on the sidewall 108 of the chamber body 102. The showerhead 130 (or lid) may be opened to allow access to the interior volume 106 of the chamber 101, and may provide a seal for the chamber 101 while closed. The gas source 160 may be coupled to the chamber 101 to provide process and/or cleaning gases to the interior volume 106 through the showerhead 130 or lid and nozzle (e.g., through apertures of the showerhead or lid and nozzle). Showerhead 130 may be used for processing chambers used for dielectric etch (etching of dielectric materials).

The showerhead 130 may include a gas distribution plate (GDP) and may have multiple gas delivery holes 132 (also referred to as channels) throughout the GDP. The showerhead 130 may be formed by metal or alloy plate with the protection by a multi-layer protective coating as described herein. The metal or alloy plate may be composed of aluminum, an aluminum alloy, or another metal or metal alloy. The showerhead 130 may be formed with the GDP bonded to an aluminum base or an anodized aluminum base. The GDP may be made from Si or SiC, or may be a ceramic such as $Y_2O_3$, $Al_2O_3$, $Y_3Al_5O_{12}$ (YAG), and so forth.

For processing chambers used for etching of conductive materials, a lid may be used rather than a showerhead. The lid may include a center nozzle that fits into a center hole of the lid. The lid may be a ceramic such as $Al_2O_3$, $Y_2O_3$, YAG, or a ceramic compound including $Y_4Al_2O_9$ and a solid-solution of $Y_2O_3$—$ZrO_2$. The nozzle may also be a ceramic, such as $Y_2O_3$, YAG, or a ceramic compound including $Y_4Al_2O_9$ and a solid-solution of $Y_2O_3$—$ZrO_2$.

Examples of processing gases that may be used to process substrates in the chamber 101 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$, and $SiF_4$, among others, and other gases such as $O_2$ or $N_2O$. Flow rates of any of these gases may be measured and regulated by the flow control apparatus 200. A remote plasma may be formed from any of these and/or other processing gases and then delivered through supply line 112, through the flow control apparatus 200, to the chamber 101. Accordingly, the remote plasma may be composed of $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases).

A substrate support assembly 148 is disposed in the interior volume 106 of the chamber 101 below the showerhead 130. The substrate support assembly 148 holds a substrate 144 during processing. A ring (e.g., a single ring) may cover a portion of the electrostatic chuck 150, and may protect the covered portion from exposure to plasma during processing. The ring may be silicon or quartz in one embodiment. An inner liner may be coated on the periphery of the substrate support assembly 148. The inner liner may be a halogen-containing gas resistant material, such as $Al_2O_3$, $Y_2O_3$, YAG, a ceramic compound including $Y_4Al_2O_9$ and a solid-solution of $Y_2O_3$—$ZrO_2$, other rare earth-containing or non-rare earth-containing ceramic materials, or combinations thereof. In one embodiment, the inner liner may be fabricated from the same materials of the outer liner 116. In some embodiments, In some embodiments, one or more sensor devices 170 may be disposed within the interior volume 106. For example, one or more sensor devices 170 may be located near (e.g., within 10 centimeters of) the showerhead 130. As another example, one or more sensor devices may be located near (e.g., within 10 centimeters of) the substrate 144, which may be used to monitor conditions near the reaction site.

In one embodiment, the substrate support assembly 148 includes a pedestal 152 that supports an electrostatic chuck 150. The electrostatic chuck 150 further includes a thermally conductive base and an electrostatic puck bonded to the thermally conductive base by a bond, which may be a silicone bond in one embodiment. The thermally conductive base and/or electrostatic puck of the electrostatic chuck 150 may include one or more optional embedded heating elements, embedded thermal isolators, and/or conduits to control a lateral temperature profile of the substrate support assembly 148. The electrostatic puck may further include multiple gas passages such as grooves, mesas, and other surface features that may be formed in an upper surface of the electrostatic puck. The gas passages may be fluidly coupled to a source of a heat transfer (or backside) gas such as helium via holes drilled in the electrostatic puck. In operation, the backside gas may be provided at controlled pressure into the gas passages to enhance the heat transfer between the electrostatic puck and a supported substrate 144. The electrostatic chuck 150 may include at least one clamping electrode controlled by a chucking power source.

Figure 2:
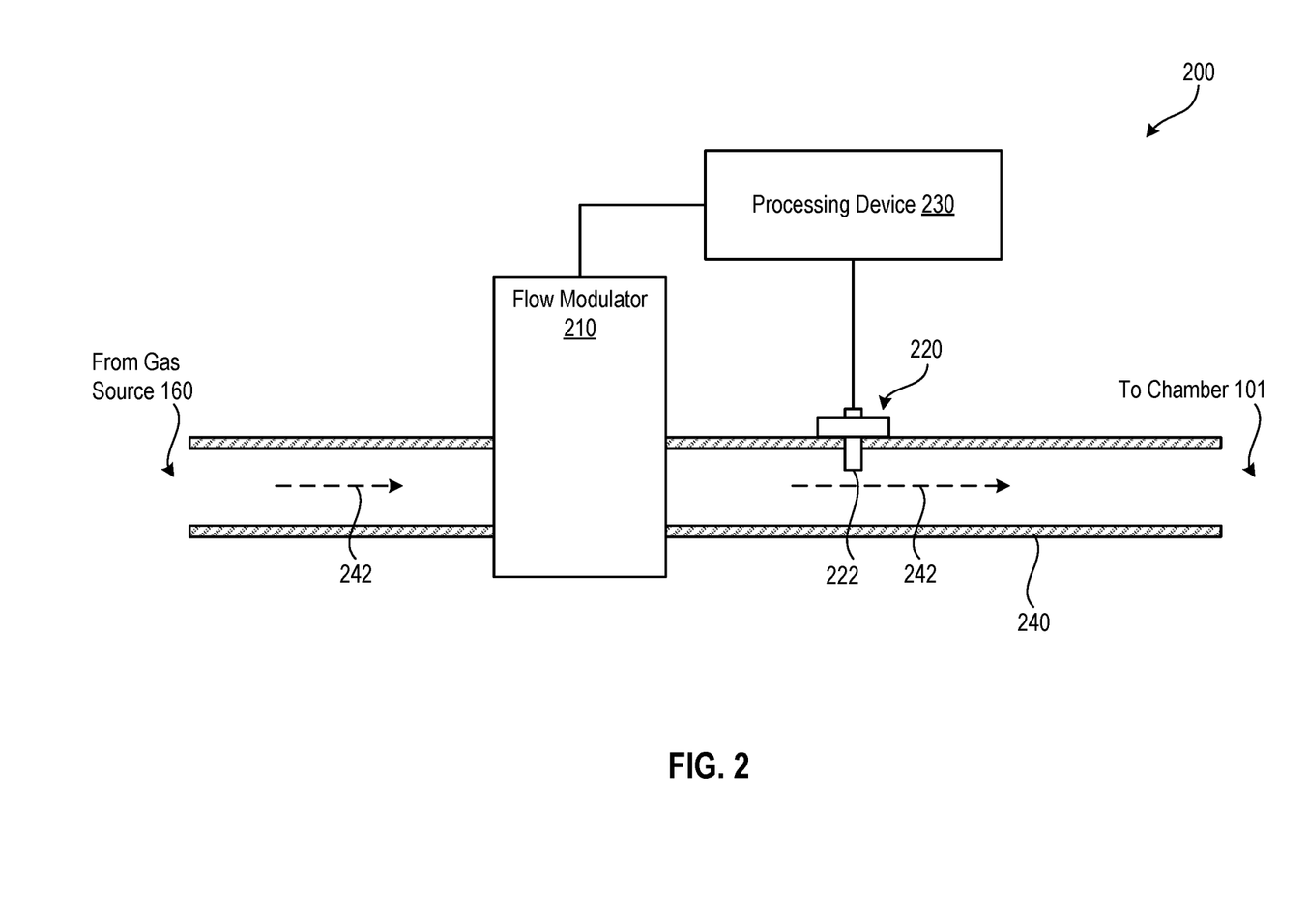
FIG. 2 illustrates an exemplary flow control apparatus in accordance with embodiments of the present disclosure.

FIG. 2 depicts the flow control apparatus 200 in accordance with embodiments of the present disclosure. The flow control apparatus 200 may be configured to measure and control a mass flow rate of a process gas and/or a cleaning gas used in a manufacturing system, and thus may be considered a type of MFC. The flow control apparatus 200 may be coupled to the gas source 160 and the chamber 101 via a gas flow channel 240. The gas flow channel may correspond to the supply line 112 of FIG. 1. In some embodiments, the flow control apparatus 200 may be incorporated into a flow ratio controller or a pulsed mass flow system.

In some embodiments, flow control apparatus 200 may include at least a flow modulator 210, a sensor device 220, and a processing device 230. Gas from the gas source 160 flows through the flow path 242 defined through gas flow channel 240 through the flow modulator 210, and to the chamber 101. In other embodiments, the gas flow channel 240 may terminate somewhere other than at the chamber 101. For example, the gas flow channel 240 may deliver gas to an open environment (e.g., an exhaust system) or a closed environment (e.g., a building or vehicle ventilation system).

In some embodiments, the flow modulator 210 is configured to restrict the gas flow through the flow path 242, and may comprise one or more flow modulating valves which may each be an actuatable valve such as, for example, a solenoid valve, a piezoelectric valve, or a motorized valve. In some embodiments, the flow modulator includes other components in addition to a valve, such as flow or temperature sensing components. In some embodiments, the flow modulator 210 functions as an MFC, such as a thermal-based MFC, a pressure-based MFC, or a rate-of-decay-based MFC.

In some embodiments where the flow modulator 210 functions as a thermal-based MFC, the flow modulator 210 includes a capillary bypass channel that branches off from the gas flow channel 240. Temperature sensors at the beginning and end of the capillary are used to compute (e.g., by the processing device 230 or an on-board processing device) a temperature delta, which is proportional to the gas flow rate.

In some embodiments where the flow modulator 210 functions as a pressure-based MFC, the flow modulator 210 includes two pressure transducers upstream and downstream from the flow modulating valve and a temperature sensor. The gas flow rate is proportional to the product of the temperature and the difference of the squares of the upstream and downstream pressures.

In some embodiments where the flow modulator 210 functions as a rate-of-decay-based MFC, the flow modulator 210 includes valves for controlling gas flow into a reservoir of a predetermined volume, and a pressure sensor for measuring the decaying pressure in the reservoir. The gas flow rate is proportional to the rate of change in pressure.

In some embodiments, the sensor device 220 is disposed downstream from the flow modulator 210. The sensor device 220 may be a part of the flow modulator 210 (e.g., adjacent to the flow modulating valve of the flow modulator 210), near (e.g., within 10 centimeters of) the flow modulator 210, near (e.g., within 10 centimeters of) an inlet of the chamber 101 or the showerhead 130, or within the chamber 101 (as illustrated in FIG. 1 with respect to sensor devices 170, which may be the same or similar to the sensor device 220).

In some embodiments, the sensor device 220 comprises a MEMS device 222, which may be configured to generate one or more signals responsive to conditions of the gas flow. For example, the MEMS device 222 may be configured to generate one or more signals indicative of a gas temperature or a gas flow rate. An exemplary MEMS device is described in greater detail below with respect to FIG. 3. In some embodiments, the sensor device 220 (and/or other sensor devices described herein) is any device that has a transient response of less than 1 millisecond, and may be a MEMS device or a non-MEMS device. In some embodiments, the sensor device 220 is mounted to the gas flow channel 240 such that the MEMS device 222 is inserted directly into the flow path 242. The sensor device 220 is coupled to the gas flow channel such that a seal is formed to prevent gas leakage. In some embodiments, the sensor device 220 includes a mounting plate to which the MEMS device 222 secured via a seal (e.g., a metal seal).

In some embodiments, the processing device 230 includes a central processing unit (CPU), microcontroller, a programmable logic controller (PLC), a system on a chip (SoC), a server computer, or other suitable type of computing device. The processing device 230 may be configured to execute programming instructions related to the operation of the flow modulator 210. The processing device 230 receives feedback signals from the sensor device 220 and, optionally, the flow modulator 210, and computes temperature, flow rate, and/or other parameters of the gas flow. The processing device 230 further transmits control signals to the flow modulator 210 based on the received feedback signals. In some embodiments, the processing device 230 is configured for high-speed feedback processing, and may include, for example, an EPM. In some embodiments, the processing device is configured to execute a process recipe, or one or more steps of a process recipe, for a fabrication process using the chamber 101. For example, the recipe may specify gas flows at particular flow rates to occur at specific times, for specific durations, and for specific gases. As another example, the recipe may specify pulses of one or more gases.

Figure 3A:
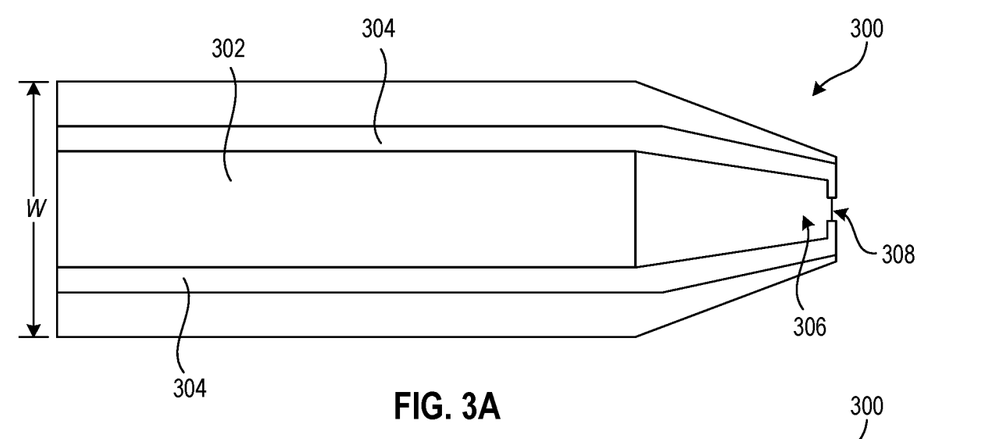
FIG. 3A illustrates a top view of an exemplary MEMS device in accordance with embodiments of the present disclosure.
Figure 3B:
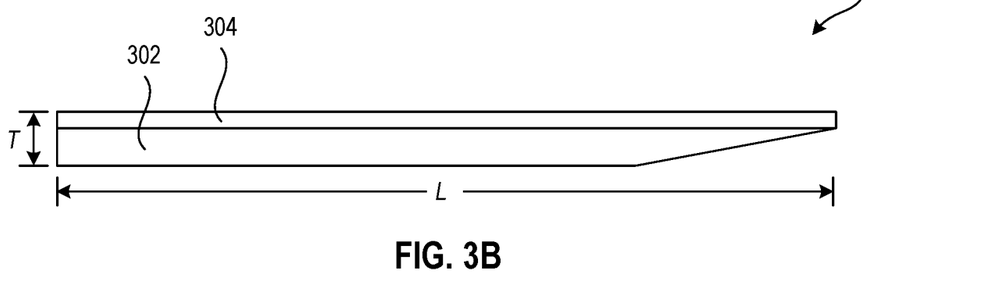
FIG. 3B illustrates a side view of the exemplary MEMS device in accordance with embodiments of the present disclosure.

FIGS. 3A and 3B illustrate a top view and side view, respectively, of an exemplary MEMS device 300 in accordance with embodiments of the present disclosure, which may be manufactured using semiconductor manufacturing techniques that would be familiar to one of ordinary skill in the art. The MEMS device 300 may be the same as or similar to the MEMS device 222 described with respect to FIG. 2. The overall dimensions of the MEMS device 300 may be characterized by a length (L) from about 2 mm to about 10 mm, a width (W) from about 1 mm to about 5 mm, and a thickness (T) of about 0.1 mm to about 1 mm. The MEMS device 300 includes an elongated support structure 302 having a substantially planar shape. The elongated support structure 302 may be formed from an insulating material or semiconductor, such as silicon, silicon having one or more oxide layers formed thereon, or any other suitable material. The elongated support structure 302 may have a tapered shape that may improve its aerodynamic properties. The tapered region may further define a cavity 306 across which a free-standing sensing element is suspended, such as a nanowire 308.

Electrodes 304 are illustrated as being disposed on a surface of the elongated support structure 302, which extend from a flat end of the elongated support structure 302 to the nanowire 308. The electrodes 304 may be formed from one or more conductive metals. The electrodes may serve as electrical contacts to which one or more devices may be operatively coupled (e.g., the processing device 230). In some embodiments, a portion of the electrodes 304 may be encapsulated or formed through an interior of the elongated support structure 302 to protect the electrodes 304 from corrosion.

Figure 3C:
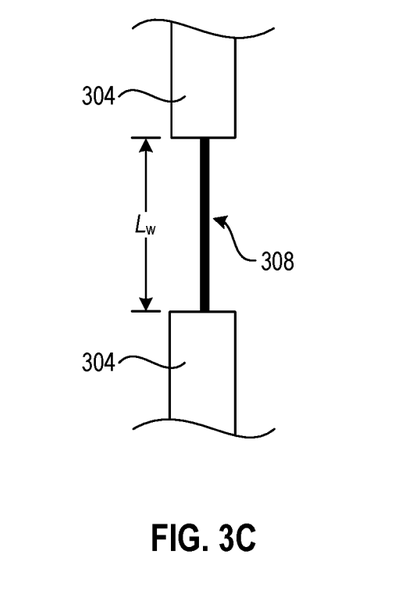
FIG. 3C illustrates a free-standing sensing element of the exemplary MEMS device in accordance with embodiments of the present disclosure.

FIG. 3C illustrates a magnified view of a nanowire 308 suspended between the two electrodes 304. As used herein, the term "nanowire" refers to a conductive body having at least two dimensions of less than 1 micrometer. In some embodiments, the nanowire 308 is formed from the same conductive material as the electrodes 304, such as platinum. For example, the nanowire 308 may be formed by depositing a metal (e.g., platinum) onto the elongated support structure 302 and selectively etching the elongated support structure 302, resulting in the free-standing nanowire 308 suspended across the cavity 306. In some embodiments, the nanowire 308 may be a single continuous filament, but may also be formed from nanoparticles or nanotubes arranged to form a conductive route. Other continuous or non-continuous structures may be utilized provided that these structures allow for an impedance to be measured across the wire.

The nanowire 308 is produced to have a length ($L_w$) longer than its diameter or width/thickness, with its dimensions being selected such that the nanowire 308 can be deflected when exposed to both low and high velocity gas flows. In some embodiments, $L_W$ is less than 1 millimeter in length, for example, from about 1 micrometer to about 500 micrometers, or from about 10 micrometers to about 200 micrometers. In some embodiments, $L_W$ is about 10 to about 100,000 times greater than its diameter or width/thickness. In some embodiments, the nanowire 308 may have a circular or rectangular cross-section having a diameter or thickness/width of about 50 nanometers to about 500 nanometers. One of ordinary skill in the art will recognize that other dimensions may be utilized.

In some embodiments, the MEMS device 300 may be configured to provide multiple sensor modes with different sensitivities along different dimensions. For example, the MEMS device 300 may be configured for constant current anemometry (CCA), where a fixed current is passed through the nanowire 308 to raise the temperature of the nanowire 308 causing an increase in resistance. During operation, gas flow over the wire removes heat from the nanowire 308 via convection, and the resistance at constant current and constant gas velocity will reach a steady state. Increases or decreases in the gas velocity will result in decreases or increases, respectively, in resistance of the nanowire 308, allowing a measured voltage output to be correlated to the gas flow rate.

As another example, the MEMS device 300 may be configured for elastic filament velocimetry (EFV). Gas velocity may be correlated to strain in the nanowire 308 due to deflection by the gas flow. In this operation, a small current may pass through the nanowire 308 that results in negligible heating. During operation, the gas flow deflects the nanowire 308, causing an internal stress that changes the resistance of the nanowire 308. The change in resistance can be correlated to the gas flow rate.

In some embodiments, the nanowire 308 may be combined on the MEMS device 300 with two or more nanowires having separate pairs of electrodes, which may each be used to separately perform CCA or EFV. In some embodiments, the two or more nanowires may be oriented in a non-collinear orientation.

Figure 4:
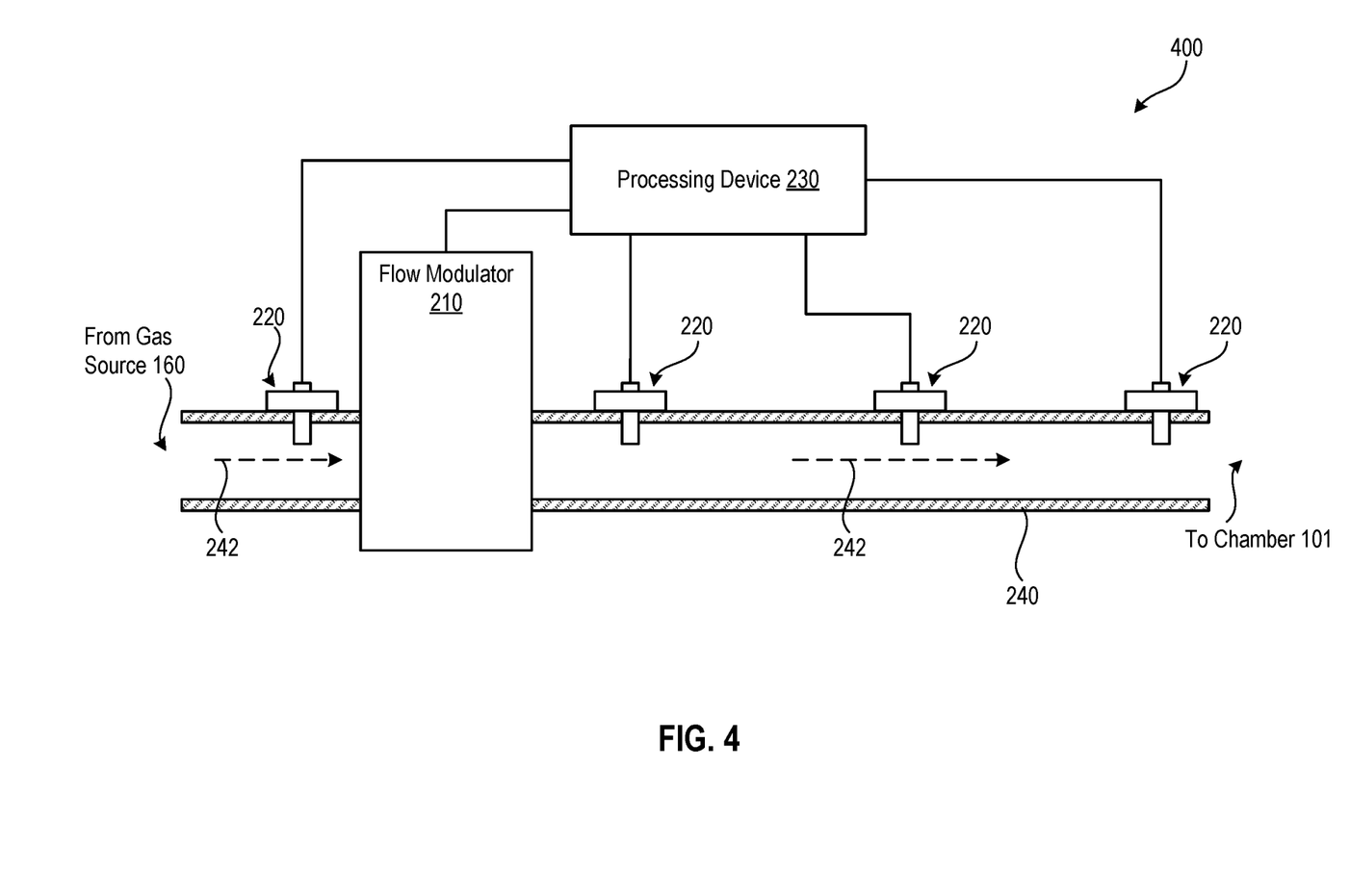
FIG. 4 illustrates an exemplary flow control apparatus with multiple sensor devices in series in accordance with embodiments of the present disclosure.
Figure 5:
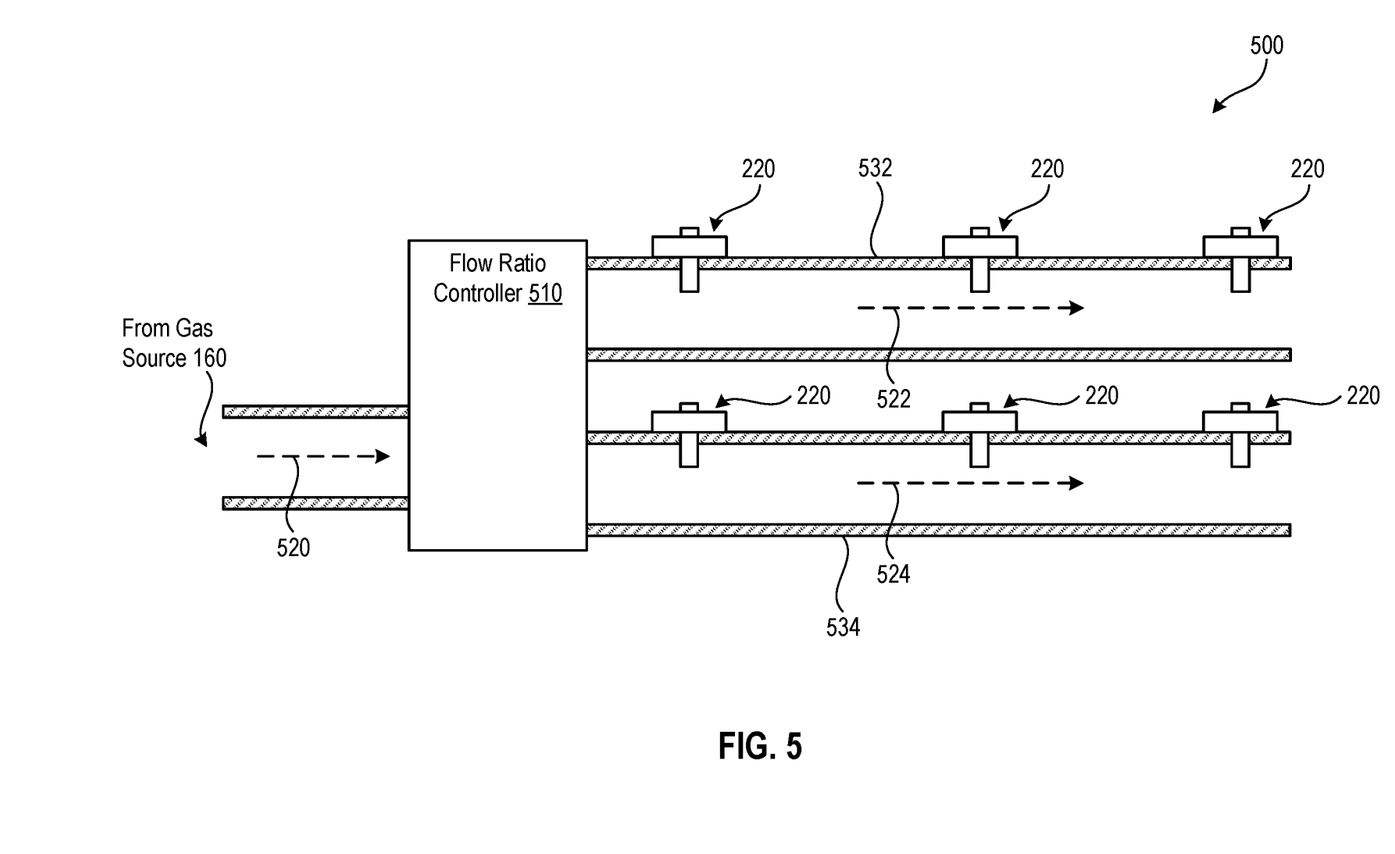
FIG. 5 illustrates an exemplary flow control apparatus utilizing a flow ratio controller in accordance with embodiments of the present disclosure.

Reference is now made to FIGS. 4 and 5, which illustrate variants of the flow control apparatus 200. FIG. 4 illustrates an exemplary flow control apparatus 400 with multiple sensor devices 220 in series in accordance with embodiments of the present disclosure. The sensor devices 220, which may be the same as or similar to those described with respect to FIG. 2, are arranged in a series configuration at various locations along the gas flow channel 240. In some embodiments, two, three, or more sensor devices 220 may be present. The sensor devices 220 located near the flow modulator 210, downstream from the flow modulator 210, and near the chamber 101 may be used by the processing device 230 to verify the flow rate at various locations of the gas flow channel 240, for example, to account for drift in or failure of one or more of the sensor devices 220. The processing device 230 may also utilize signals from the sensor devices 220 at various distances from the flow modulator 210 to account for signal delays when controlling the flow modulator 210. In some embodiments, additional sensor devices 220 may be present, for example, upstream from the flow modulator 210. In some embodiments, two or more sensor devices may be used for exhaust/foreline flow rate measurements. For example, a sensor device near the gas source 160 and one or more sensor devices downstream from the flow modulator 210 may be used to by the processing device 230 to compare a total flow rate from upstream near the gas source 160 with a flow rate downstream (e.g., an exhaust/foreline flow rate) in order to compute a reaction rate or efficiency.

FIG. 5 illustrates an exemplary flow control apparatus 500 utilizing a flow ratio controller 510 in accordance with embodiments of the present disclosure. The processing device 230 and the connections thereto are omitted from FIG. 5 so as to not obscure the drawing. The flow ratio controller 510 may be configured to split a gas flow from an incoming flow path 520 into two or more separate flow paths 522 and 524 defined by gas flow channels 532 and 534, respectively. The sensor devices 220 are arranged in parallel (or in other configurations) at various locations along the flow paths 522 and 524 to monitor conditions of the gas flows. Each of the sensor devices 220 generates signals indicative of flow rate and/or temperature. Signals from sensor devices 220 in the two or more flow paths are provided to the processing device 230, and the processing device 230 uses those signals to determine a current ratio of gas being delivered to those various flow paths. The flow ratio controller 510 may then adjust the amount of gas delivered into the various flow paths to achieve a target flow ratio. In some embodiments, more than one gas flow may be received by the flow ratio controller 510, which may be mixed and routed through the flow paths 522 and 524 or additional flow paths.

Figure 6:
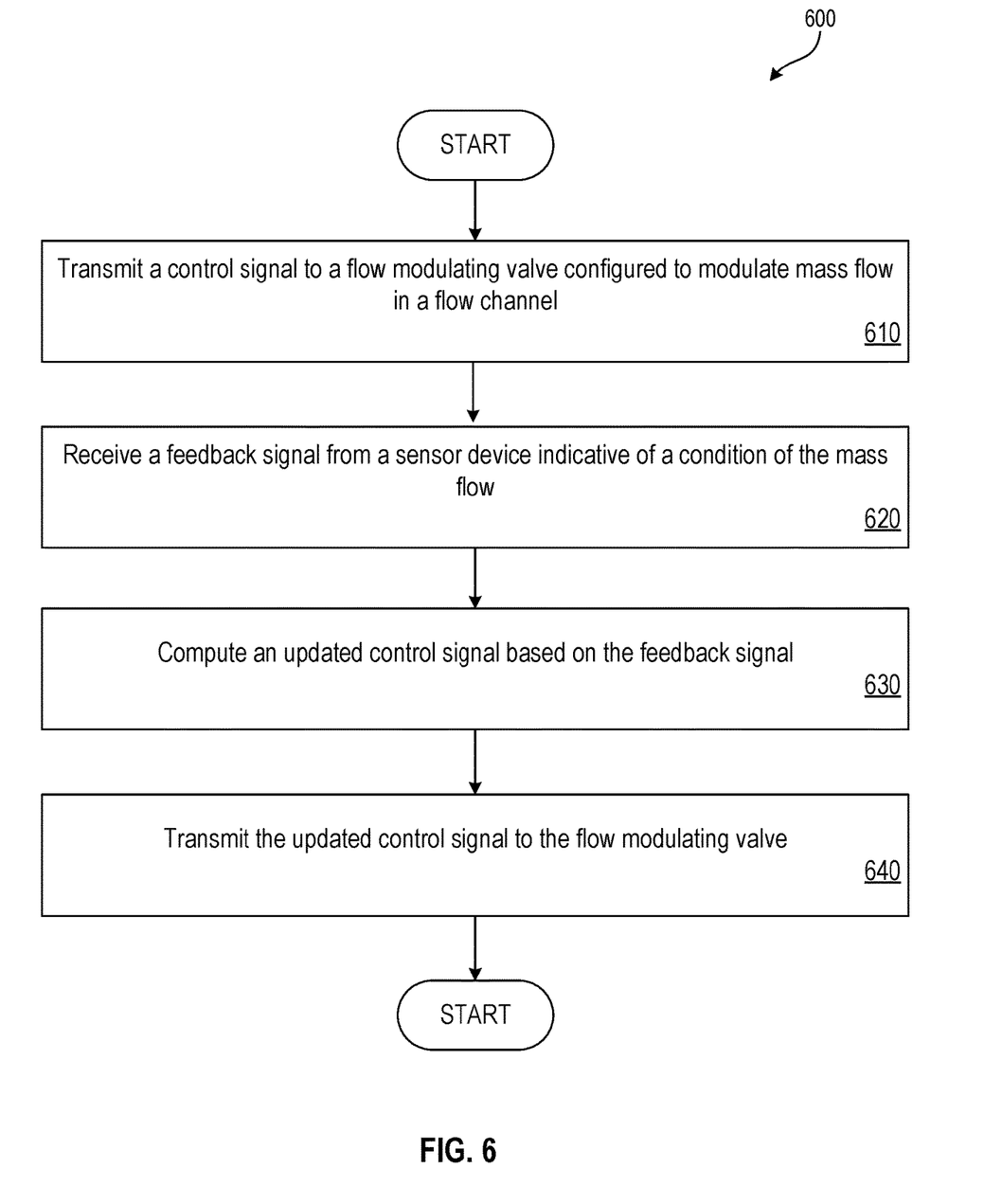
FIG. 6 illustrates a method for modulating gas flow in a gas flow channel in accordance with embodiments of the present disclosure.

FIG. 6 illustrates a method 600 for modulating mass flow in a flow channel in accordance with embodiments of the present disclosure. Some or all of the operations of method 600 may be performed, for example, by a processing device of a flow control apparatus, such as the processing device 230 of the flow control apparatus 200. Some or all of the operations may also be performed by an MFC or another suitable device.

At block 610, the processing device (e.g., the processing device 230) transmits a control signal to a flow modulating valve (e.g., a flow modulating valve of the flow modulator 210), which is configured to modulate mass flow in a flow channel (e.g., the gas flow channel 240). The signal may, for example, indicate a flow threshold or setpoint for the flow modulating valve, which actuates the flow modulating valve to achieve a target flow rate for the gas flow channel. In some embodiments, the flow modulating valve comprises an actuatable valve, such as a piezoelectric valve, a solenoid valve, or a motorized valve. The mass flow may comprise a flow of a gaseous species, a non-gaseous species (e.g., a vaporized precursor), or a combination thereof. It is to be understood that any of the embodiments described herein may be used for mass flow generally, and are not limited to flows of gaseous species.

At block 620, a feedback signal from a sensor device (e.g., the MEMS device 222) is received by the processing device. The sensor device may be a MEMS device or any other device having a transient response of 1 millisecond or less. In some embodiments, the feedback signal is indicative of a condition of the gas flow (e.g., a gas temperature, a gas velocity or flow rate, a gas pressure, etc.). In some embodiments, the MEMS device is disposed downstream from the flow modulating valve (e.g., as depicted in FIG. 2). In some embodiments, the MEMS device is disposed upstream from the flow modulating valve (e.g., as depicted in FIG. 4). In some embodiments, the MEMS device comprises a free-standing sensing element (e.g., the nanowire 308) that is disposed directly in a flow path (e.g., the flow path 242) of the gas flow channel.

In some embodiments, more than one MEMS device may be utilized (e.g., as depicted in FIGS. 4 and 5) from which multiple signals are received by the processing device. In some embodiments, a transient response of the feedback signals generated by any of the one or more MEMS devices is less than 1 millisecond.

In some embodiments, the flow modulating valve is part of an MFC that contains one or more sensor devices. For example, in some embodiments, the flow modulating valve is part of a thermal-based MFC, a pressure-based MFC, or a rate-of-decay-based MFC. In some embodiments, the processing device receives signals from the one or more sensor devices associated with the MFC device. Although such signals typically have a transient response rate on the order of 100 milliseconds or longer, the processing device may compare these signals with the signal received by the MEMS device, for example, for verification or calibration purposes.

At block 630, the processing device computes an updated control signal based on the feedback signal from the MEMS device. In some embodiments, the processing device computes a mass flow temperature, a mass flow pressure, a mass velocity, or mass flow rate, or other parameter based on the feedback signal. In some embodiments, a turn-down ratio of the mass flow rate (i.e., the highest measurable flow rate divided by the lowest measurable flow rate) is at least 200. In some embodiments, the updated control signal corresponds to a new threshold or setpoint for the flow modulating valve to ensure that the target flow rate is achieved. For example, if the computed flow rate is greater than the target, the updated control signal corresponds to a new threshold or setpoint to cause the flow modulating valve to restrict the flow further. In some embodiments, if multiple signals are received from multiple MEMS device, the processing device may, for example, compute an average signal from the multiple signals and/or detect discrepancies in the signals. Such discrepancies may be indicative of failure of or drift in one of the MEMS devices.

At block 640, the processing device transmits the updated control signal to the flow modulating valve. In some embodiments, the processing device generates one or more pulsed control signals based on the feedback signal from the MEMS device. For example, the pulsed control signal may cause the flow modulating valve to produce gas flow pulses having pulse widths of, for example, less than 50 milliseconds, less than 40 milliseconds, less than 30 milliseconds, or less than 20 milliseconds. In some embodiments, the method 600 is performed over several cycles, for instance, as part of the execution of a process recipe for a manufacturing system.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring instructions for performing such methods to computing devices. The term "article of manufacture," as used herein, is intended to encompass a computer program accessible from any computer-readable device or storage media.

Figure 7:
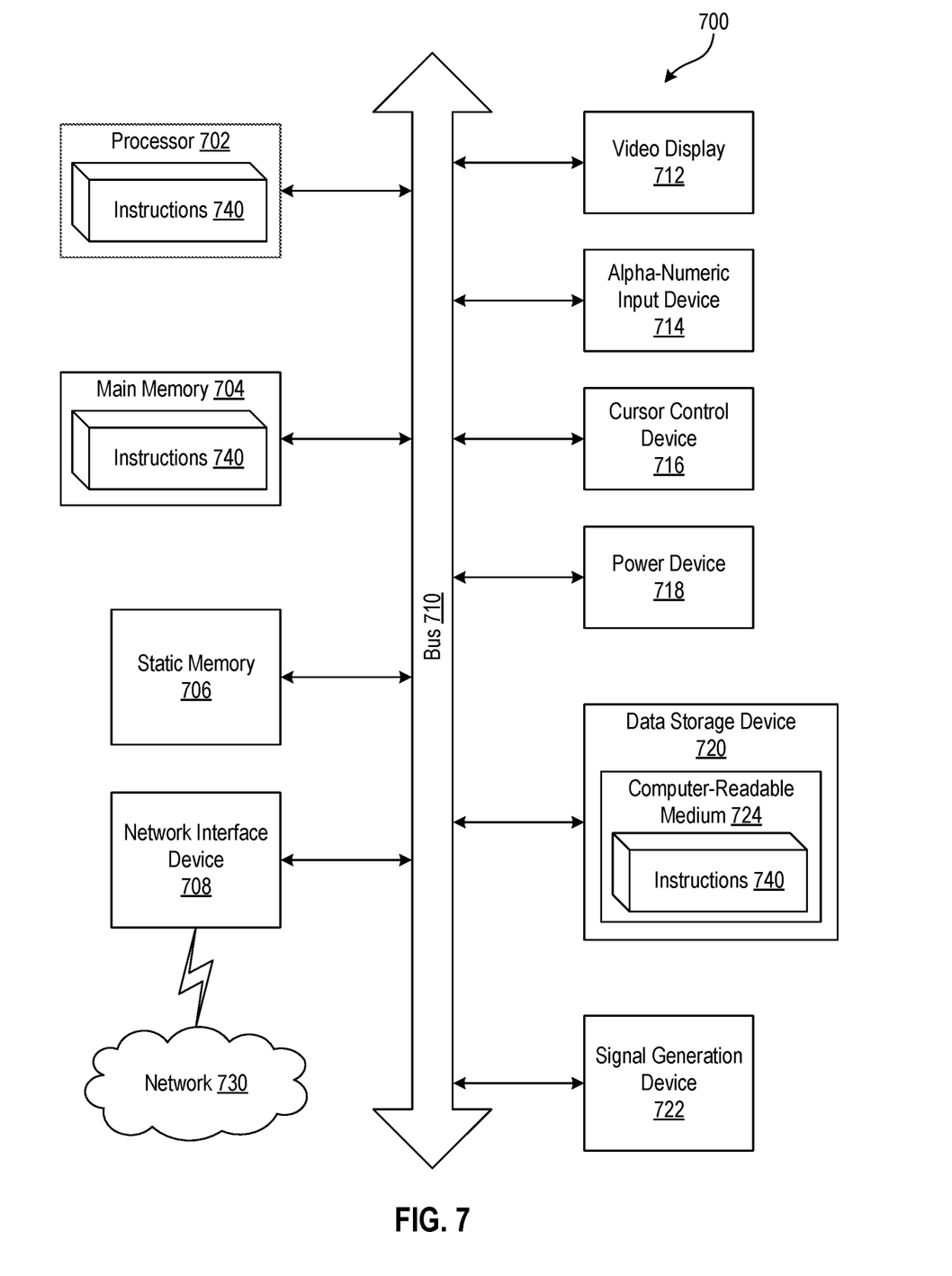
FIG. 7 is a block diagram illustrating a computer system for use in accordance with the embodiments of the present disclosure.

FIG. 7 illustrates a diagrammatic representation of a machine in the exemplary form of a computer system 700 within which a set of instructions (e.g., for causing the machine to perform any one or more of the methodologies discussed herein) may be executed. In alternative implementations, the machine may be connected (e.g., networked) to other machines in a LAN, a WAN, an intranet, an extranet, or the Internet. The machine may operate in the capacity of a server or a client machine in client-server network environment, or as a peer machine in a peer-to-peer (or distributed) network environment. The machine may be a personal computer (PC), a tablet PC, a PDA, a cellular telephone, a web appliance, a server, a network router, switch or bridge, or any machine capable of executing a set of instructions (sequentially or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. Some or all of the components of the computer system 700 may be utilized by or illustrative of any of the electronic components described herein (e.g., the processing device 230 or any electronic components utilized in connection with the operation of the chamber 101 or the flow modulator 210).

The exemplary computer system 700 includes a processing device (processor) 702, a main memory 704 (e.g., ROM, flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage device 720, which communicate with each other via a bus 710.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processor 702 may also be one or more special-purpose processing devices such as an application specific integrated circuit (ASIC), a field programmable gate array (FPGA), a digital signal processor (DSP), network processor, or the like. The processor 702 is configured to execute instructions 740 for performing the operations discussed herein.

The computer system 700 may further include a network interface device 708. The computer system 700 also may include a video display unit 712 (e.g., a liquid crystal display (LCD), a cathode ray tube (CRT), or a touch screen), an alphanumeric input device 714 (e.g., a keyboard), a cursor control device 716 (e.g., a mouse), and a signal generation device 722 (e.g., a speaker).

Power device 718 may monitor a power level of a battery used to power the computer system 700 or one or more of its components. The power device 718 may provide one or more interfaces to provide an indication of a power level, a time window remaining prior to shutdown of computer system 700 or one or more of its components, a power consumption rate, an indicator of whether computer system is utilizing an external power source or battery power, and other power related information. In some implementations, indications related to the power device 718 may be accessible remotely (e.g., accessible to a remote back-up management module via a network connection). In some implementations, a battery utilized by the power device 718 may be an uninterruptable power supply (UPS) local to or remote from computer system 700. In such implementations, the power device 718 may provide information about a power level of the UPS.

The data storage device 720 may include a computer-readable storage medium 724 (e.g., a non-transitory computer-readable storage medium) on which is stored one or more sets of instructions 740 (e.g., software) embodying any one or more of the methodologies or functions described herein. These instructions 740 may also reside, completely or at least partially, within the main memory 704 and/or within the processor 702 during execution thereof by the computer system 700, the main memory 704, and the processor 702 also constituting computer-readable storage media. The instructions 740 may further be transmitted or received over a network 730 (e.g., the network 14) via the network interface device 708. While the computer-readable storage medium 724 is shown in an exemplary implementation to be a single medium, it is to be understood that the computer-readable storage medium 724 may include a single medium or multiple media (e.g., a centralized or distributed database, and/or associated caches and servers) that store the one or more sets of instructions 740.

In the foregoing description, numerous details are set forth. It will be apparent, however, to one of ordinary skill in the art having the benefit of this disclosure, that the present disclosure may be practiced without these specific details. While specific embodiments have been described herein, it should be understood that they have been presented by way of example only, and not limitation. The breadth and scope of the present application should not be limited by any of the embodiments described herein, but should be defined only in accordance with the following and later-submitted claims and their equivalents. Indeed, other various implementations of and modifications to the present disclosure, in addition to those described herein, will be apparent to those of ordinary skill in the art from the foregoing description and accompanying drawings. Thus, such other implementations and modifications are intended to fall within the scope of the present disclosure.

References were made to the accompanying drawings, which form a part of the description and in which are shown, by way of illustration, specific embodiments. Although these disclosed embodiments are described in sufficient detail to enable one skilled in the art to practice the embodiments, it is to be understood that these examples are not limiting, such that other embodiments may be used and changes may be made to the disclosed embodiments without departing from their spirit and scope. For example, the blocks of the methods shown and described herein are not necessarily performed in the order indicated in some other embodiments. Additionally, in some other embodiments, the disclosed methods may include more or fewer blocks than are described. As another example, some blocks described herein as separate blocks may be combined in some other embodiments. Conversely, what may be described herein as a single block may be implemented in multiple blocks in some other embodiments. Additionally, the conjunction "or" is intended herein in the inclusive sense where appropriate unless otherwise indicated; that is, the phrase "A, B, or C" is intended to include the possibilities of "A," "B," "C," "A and B," "B and C," "A and C," and "A, B, and C."

The words "example" or "exemplary" are used herein to mean serving as an example, instance, or illustration. Any aspect or design described herein as an "example" or "exemplary" is not necessarily to be construed as preferred or advantageous over other aspects or designs. Rather, use of the words "example" or "exemplary" is intended to present concepts in a concrete fashion. When the term "about" or "approximately" is used herein, this is intended to mean that the nominal value presented is precise within ±10%.

In addition, the articles "a" and "an" as used herein and in the appended claims should generally be construed to mean "one or more" unless specified otherwise or clear from context to be directed to a singular form. Reference throughout this specification to "an embodiment," "one embodiment," "some embodiments," or "certain embodiments" indicates that a particular feature, structure, or characteristic described in connection with the embodiment is included in at least one embodiment. Thus, the appearances of the phrase "an embodiment," "one embodiment," "some embodiments," or "certain embodiments" in various locations throughout this specification are not necessarily all referring to the same embodiment.

Some portions of the detailed description may be presented in terms of algorithms and symbolic representations of operations on data bits within a computer memory. These algorithmic descriptions and representations are the manner used by those skilled in the data processing arts to most effectively convey the substance of their work to others skilled in the art. An algorithm is herein, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, or otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "receiving," "retrieving," "transmitting," "computing," "generating," "processing," "reprocessing," "adding," "subtracting," "multiplying," "dividing," "optimizing," "calibrating," "detecting," "performing," "analyzing," "determining," "enabling," "identifying," "modifying," "transforming," "applying," "causing," "storing," "comparing," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission, or display devices.

Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein, along with the full scope of equivalents to which such claims are entitled.

What is claimed is:

1. A mass flow control apparatus comprising:
   a flow modulating valve configured to modulate gas flow in a gas flow channel;
   a sensor device configured to generate a signal responsive to a condition of the gas flow, wherein a transient response of the sensor device is 1 millisecond or less; and
   a processing device operatively coupled to the flow modulating valve and the sensor device, the processing device being configured to control the flow modulating valve based on a signal received from the sensor device.

2. The mass flow control apparatus of claim 1, wherein the sensor device comprises a MEMS device.

3. The mass flow control apparatus of claim 2, wherein the MEMS device comprises a free-standing sensing element.

4. The mass flow control apparatus of claim 3, wherein the free-standing sensing element is disposed directly in a flow path defined by the gas flow channel.

5. The mass flow control apparatus of claim 1, wherein the signal generated by the sensor device is indicative of one or more of a gas flow rate or a gas temperature.

6. The mass flow control apparatus of claim 1, wherein the flow modulating valve comprises a piezoelectric valve, a solenoid valve, or a motorized valve, and wherein the sensor device is disposed downstream from the flow modulating valve in the gas flow channel.

7. The mass flow control apparatus of claim 1, wherein the mass flow control apparatus is incorporated into a flow ratio controller or a pulsed mass flow system.

8. A system comprising:
   a process chamber;
   a gas flow channel arranged to deliver gas from a gas source to the process chamber;
   a flow modulating valve configured to modulate gas flow in the gas flow channel;
   a plurality of micro-electromechanical (MEMS) devices downstream from the flow modulating valve and arranged in series along the gas flow channel, wherein each of the plurality of MEMS devices is configured to generate a signal responsive to a condition of the gas flow; and a processing device operatively coupled to the flow modulating valve and each of the plurality of MEMS devices, the processing device being configured to control the flow modulating valve based on signals received from the each of the plurality of MEMS devices.

9. The system of claim 8, wherein at least one of the one or more MEMS devices is downstream from the flow modulating valve and is disposed near an inlet of the process chamber.

10. The system of claim 8, wherein at least one of the one or more MEMS devices is downstream from the flow modulating valve and is disposed within the process chamber near a reaction site.

11. The system of claim 8, wherein the processing device is configured to receive gas flow signals from each of the plurality of MEMS devices and compute a gas flow rate that accounts for drift in one or more of the plurality of MEMS devices.

12. The system of claim 8, wherein the flow modulating valve comprises a flow ratio controller that modulates gas flow through a plurality of gas flow channels that includes the gas flow channel, wherein the one or more MEMS devices comprise a plurality of MEMS device each distributed among the plurality of gas flow channels.

13. The system of claim 8, wherein the one or more MEMS devices are configured to generate signals indicative of one or more of a gas flow rate or a gas temperature.

14. A method comprising:
transmitting, by a processing device, a control signal to a flow modulating valve configured to modulate mass flow in a flow channel;
receiving, by the processing device, a feedback signal from a micro-electromechanical (MEMS) device disposed downstream from the flow modulating valve, the feedback signal being indicative of a condition of the mass flow, wherein the feedback signal generated by the MEMS device is indicative of one or more of a mass flow rate or a gas temperature, and wherein a turn-down ratio of the mass flow rate is at least 200;
computing, by the processing device, an updated control signal based on the feedback signal from the MEMS device; and
transmitting, by the processing device, the updated control signal to the flow modulating valve.

15. The method of claim 14, wherein the MEMS device comprises a free-standing sensing element.

16. The method of claim 14, wherein a transient response of the feedback signal generated by the MEMS device is less than 1 millisecond.

17. The method of claim 14, wherein the flow modulating valve comprises a piezoelectric valve, a solenoid valve, or a motorized valve.

18. The method of claim 14, further comprising:
generating, by the processing device, pulsed control signals based on the feedback signal from the MEMS device; and
transmitting the pulsed control signals to the flow modulating valve to cause the flow modulating valve to produce mass flow pulses having pulse widths of less than 30 milliseconds.

* * * * *